United States Patent
Giduturi et al.

(10) Patent No.: US 6,492,843 B1
(45) Date of Patent: Dec. 10, 2002

(54) RANDOM FREQUENCY CLOCK GENERATOR

(75) Inventors: Hari R. Giduturi, Folsom; Jahanshir J. Javanifard, Carmichael, both of CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/675,501

(22) Filed: Sep. 29, 2000

(51) Int. Cl.[7] .................................................. H03K 3/84
(52) U.S. Cl. ......................................... 327/47; 327/164
(58) Field of Search ............................ 327/164, 44, 45, 327/47, 52, 113, 291, 294, 298, 337, 554, 561, 563; 330/9

(56) References Cited

U.S. PATENT DOCUMENTS

| | | |
|---|---|---|
| 4,475,090 A | 10/1984 | Stern |
| 5,007,087 A * | 4/1991 | Bernstein et al. ............. 380/46 |
| 5,329,281 A * | 7/1994 | Baumgartner et al. ...... 341/139 |
| 5,565,812 A * | 10/1996 | Soenen ........................ 327/558 |
| 5,583,359 A | 12/1996 | Ng et al. |
| 5,926,066 A * | 7/1999 | Sauer ............................. 330/9 |
| 5,939,766 A | 8/1999 | Stolmeijer et al. |
| 5,982,018 A | 11/1999 | Wark et al. |
| 6,061,702 A | 5/2000 | Hoffman |
| 6,165,814 A | 12/2000 | Wark et al. |

OTHER PUBLICATIONS

C. D. Motchenbacher and J. A. Connelly, Low–Noise Electronic System Design, 1993—52 pages, John Wiley & Sons, Inc. 1993 New York, N.Y. USA.

PCT Notification of Transmittal of The International Search Report or The Declaration for PCT Counterpart Application No. PCT/US01/30297 Containing International Search Report (Apr. 9, 2002).

* cited by examiner

Primary Examiner—My-Trang Nu Ton
(74) Attorney, Agent, or Firm—Blakely, Sokoloff, Taylor & Zafman LLP

(57) ABSTRACT

What is disclosed is a system and method of generating a random frequency. First a fundamental noise signal from a fundamental noise source is detected. Then the fundamental noise signal is amplified. The amplified fundamental noise signal is then mixed with an oscillator signal. For one embodiment, the system is carried out in a single integrated circuit.

34 Claims, 9 Drawing Sheets

RANDOM FREQUENCY CLOCK GENERATOR

FIELD OF THE INVENTION

The present invention relates to frequency generators and oscillators and more specifically to random frequency generators.

BACKGROUND OF THE INVENTION

Prior art random frequency generators rely upon random frequency sources such as a pseudo-random binary sequence (PRBS) generator, or sampling the output of a pseudo-random number generator or an unstable oscillator. Still other prior art random frequency generators include sampling an artificial noise source such as shot noise from a reverse-biased junction. Additional methods of generating random frequencies exist but each of the prior art methods ultimately have at least some level of order to them. This level of order results in a not fully random frequency output.

BRIEF DESCRIPTION OF THE DRAWINGS

The present invention is illustrated by way of example and not limitation in the figures of the accompanying drawings in which like references indicate similar elements.

DETAILED DESCRIPTION

What is disclosed is a system and method of generating a random frequency. First a fundamental noise signal from a fundamental noise source is detected. Then the fundamental noise signal is amplified. The amplified fundamental noise signal is then mixed with an oscillator control signal. For one embodiment, the system is carried out in a single integrated circuit.

Figure 1:
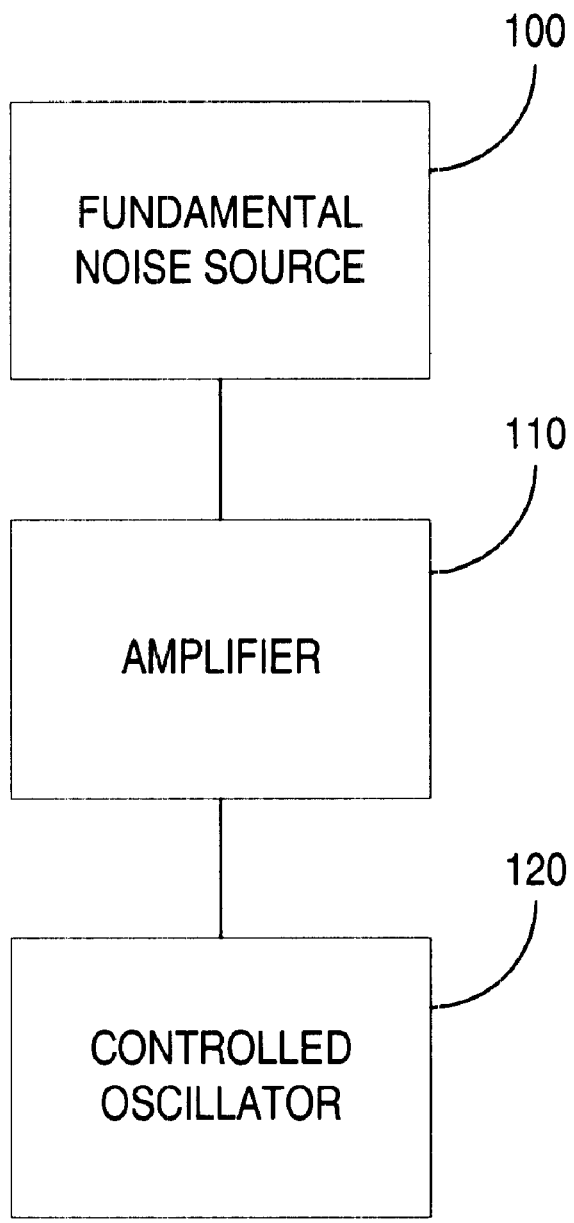
FIG. 1 illustrates a block diagram of a random frequency generator of one embodiment.

FIG. 1 illustrates a block diagram of one embodiment of the present invention. This embodiment is an electrical system that generates a clock waveform whose frequency varies randomly about a mean frequency. The components of the system include a true random noise source 100, an amplifier 110 and a controlled oscillator 120. The true random noise source 100 produces a true random noise signal that is then amplified by the amplifier 110. The controlled oscillator 120 oscillates about a mean frequency. The output of the amplifier is coupled to the control inputs of the controlled oscillator 120 to cause the output frequency of the controlled oscillator to randomly vary from the mean frequency.

Figure 1A:
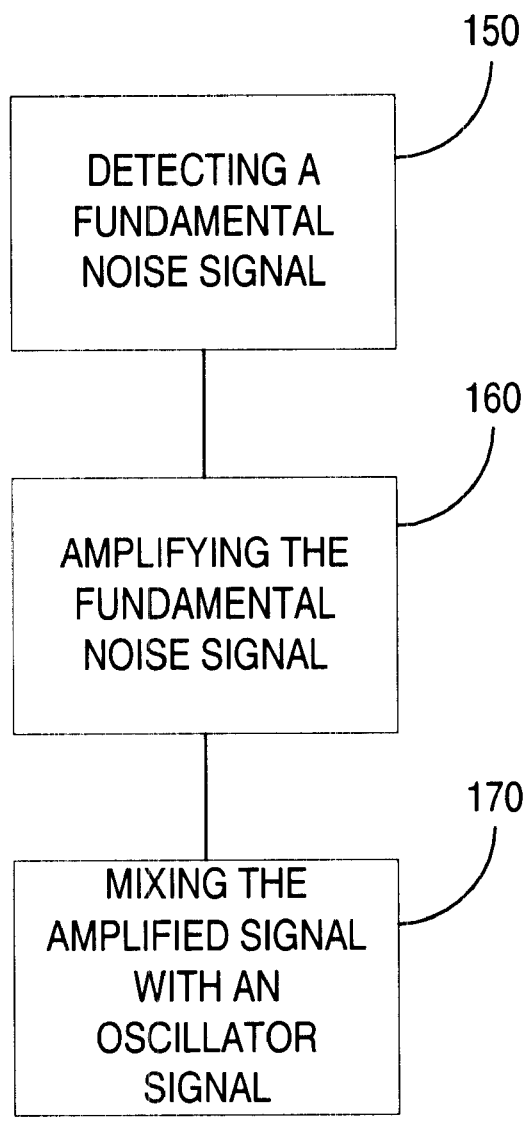
FIG. 1A illustrates a flow chart of a method of generating a random frequency of one embodiment.

FIG. 1A illustrates a flowchart of a process for generating a random frequency for one embodiment. First, a noise signal from a fundamental noise source is detected 150. Next, the fundamental noise signal is amplified 160 and then the amplified, fundamental noise signal is mixed 170 with an oscillator signal to produce a random frequency output.

For one embodiment, the true random noise source 100 is a fundamental noise source. There are three main types of fundamental noise mechanisms: thermal noise, shot noise, and low frequency (1/f) noise. Thermal noise is the noise most often encountered. One special type of thermal noise is limited by shunt capacitance and is referred to as kT/C noise. C. D. Motchenbacher and J. A. Connelley discuss noise sources in their text "Low Noise Electronic System Design", 1993, ISBN 0471577421, published by John Wiley & Sons.

The random, thermally excited vibration of charge carriers in a conductor causes thermal noise. This carrier motion is similar to the Brownian motion of particles. In every conductor or resistor at a temperature above absolute zero (0 Kelvin), the electrons are in random motion and this vibration is dependent upon temperature. Because each electron carries a charge of $1.602 \times 10^{-19}$ C, there are many small current surges as electrons randomly move about in the material of the conductor or resistor. Although the average current in the conductor or resistor resulting from these vibrations is zero, instantaneously there is current fluctuation that gives rise to a voltage across the terminals of the conductor or resistor.

The available noise power in a conductor, $N_t$, is determined by the relationship illustrated in Formula 1. $N_t$, is found to be proportional to the absolute temperature and the bandwidth of the measuring system.

$$N_t = kT \Delta f \quad \text{Formula 1}$$

Where:

k is equal to Boltzmann's constant, $1.38 \times 10^{-23}$ W–s/K.

T is the temperature of the conductor in Kelvin (K).

$\Delta f$ is equal to the noise bandwidth of the measuring system in hertz (Hz).

For example, at room temperature i.e. 290 K, for a 1.0 Hz bandwidth, $N_t = 4 \times 10^{-2}$ W. This is –204 dB when referenced to 1 W.

The noise power ($N_t$) predicted by Formula 1 is caused by the thermal agitation of the carriers. Of course, one skilled in the art is well aware of other noise sources that could also be present but the other such noise sources are excluded for the immediate discussion. Thus, the thermal noise represents a minimum level of noise in a restrictive element such as a conductor or resistor.

Formula 1 also shows that noise power ($N_t$) is also proportional to noise bandwidth. There is equal noise power in each hertz of noise bandwidth. For example, the noise power in the band from 1 to 2 Hz is equal to the noise power from 1000 to 1001 Hz. This relationship results in thermal noise often being referred to as white noise. White implies that the noise is made up of many frequency components just as white light is made up of many colors. A Fourier analysis gives a flat plot of noise versus frequency.

The thermal noise voltage ($E_t$), in rms, of a resistance is determined by Formula 2:

$$E_t = \text{sqrt}(4kTR\Delta f) \quad \text{Formula 2}$$

Where:

R is the resistance or real part of the conductor's impedance.

T is the temperature of the conductor in Kelvin (K).

k is equal to Boltzmann's constant, $1.38 \times 10^{-23}$ W-s/K.

$\Delta f$ is equal to the noise bandwidth of the measuring system in hertz (Hz).

For example where the T=290 K (room temperature), solving for $4kT=1.61 \times 10^{-20}$. Using a resistor R=1000 ohms, $E_t=4$ nV rms in a noise bandwidth of 1 Hz.

Several important observations can be made from Formula 2. Noise voltage ($E_t$) is proportional to the square root of the noise bandwidth, no matter where the frequency band is centered. The resistance is not limited to the dc resistance of the device or component, but is more exactly, defined as the real part of the complex impedance. In the case of inductance, impedance can include eddy current losses. Also, because the noise voltage is proportional to temperature, if a conductor or resistor is cooled, the thermal noise is decreased.

Noise bandwidth ($\Delta f$) is not the same as the commonly used–3 dB bandwidth of an amplifier. The bandwidth of an amplifier is defined as the frequency span between the half power points, i.e. the points on the frequency axis where the signal transmission has been reduced by 3 dB from the central or midrange value. A–3 dB reduction represents a loss of 50% in the power level and corresponds to a voltage level equal to 0.707 of the voltage at the center frequency reference.

Noise bandwidth ($\Delta f$) is the frequency span of a rectangularly shaped power gain curve equal in area to the area of the actual power gain versus frequency curve, divided by the peak amplitude of the curve as expressed in Formula 3:

$$\Delta f = 1/G_o \int_0^\infty G(f)df \qquad \text{Formula 3}$$

Figure 2:
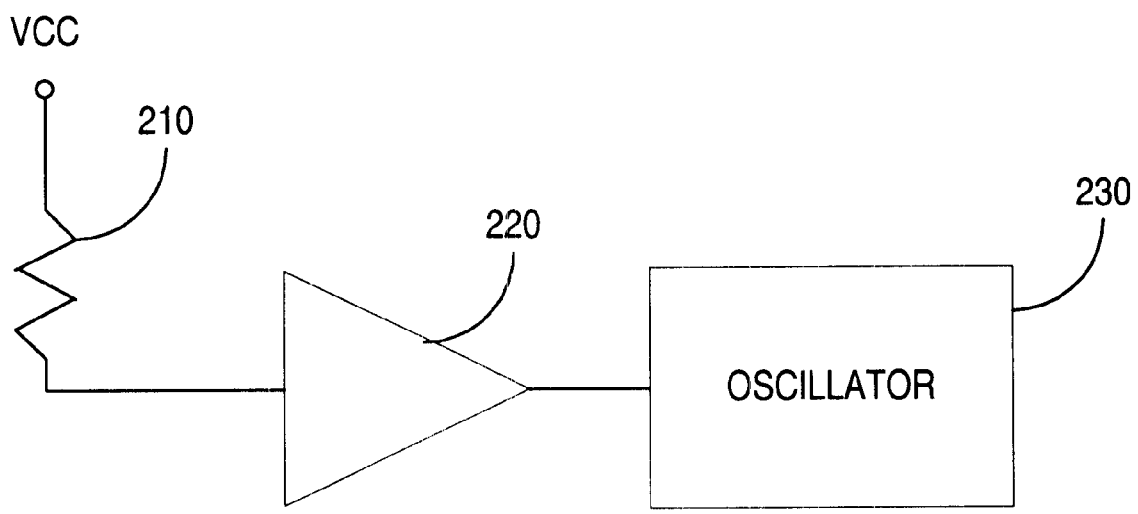
FIG. 2 shows a simplified schematic diagram of a random frequency generator of one embodiment.

For one embodiment, the true random noise source 100 includes a circuit for detecting the thermal noise generated by a resistor 210 as shown in FIG. 2. The thermal noise is then amplified in amplifier 220 and the amplified noise is coupled to the oscillator 230 to modulate the oscillation frequency of the oscillator 230. As described above regarding Formula 2, the thermal noise source produces a very small signal voltage. Typically this signal voltage is in the range of 5–50 $\mu$V at the source. Because the thermal noise source is such a low magnitude, induced voltages can over-ride and virtually eliminate the noise signal.

For one embodiment, the thermal noise source is shielded from induced voltages and noises from other sources external to the circuit. For another embodiment, the circuit conductors are also shielded from external voltages and noises from other sources external to the circuit. Examples of such noises for other sources include substrate noise, coupling from neighboring digital signals and other sources. The power supplies are also isolated from noises from other sources external to the circuit for still another embodiment. The circuit components can also be physically arranged so as to minimize induced voltages and currents from nearby circuits. For example, the conductors can be arranged at precise angles, such as perpendicular to a neighboring circuit, so as to minimize induced voltages from the neighboring circuit. For another embodiment, the circuit components can be physically shielded so as to minimize induced voltages and currents from nearby circuits.

For one embodiment, physical shielding the circuit components include shielding using a guard ring structure. Guard ring structures substantially block external noise signals flowing parallel to the surface of the substrate. For alternative embodiments multiple guard ring structures can be used such as double, triple or more guard rings. For one embodiment the conductors connecting the thermal noise resistors to the inputs of the first stage amplifier are shielded by placing shielding metal or conductive lines on both sides of the conductors. The additional metal or conductive lines are connected to either ground or VCC. For another embodiment, the switches 450, 452 are also shielded similarly to the conductors connecting the thermal noise resistors the inputs of the first stage amplifier. For another embodiment, the switches are enclosed in a guard ring structure. Alternatively, multiple guard ring structures can be used.

For one embodiment, the resistors are built from polysilicon on a substrate. An n-well tub is constructed beneath and around the resistors and the n-well tub is coupled to VCC or ground. The n-well tub substantially blocks noise signals flowing mostly perpendicular to the surface of the substrate. For an alternative embodiment, the capacitors 460, 462 are constructed from DMOS transistors constructed in an n-well tub similar to the resistors described above.

For an alternative embodiment, circuit components are physically separated from external noise sources. For one example, no signals or signal paths are allowed to run on top of any of the devices belonging to the amplifier 420, 330, 220. For another embodiment the complete amplifier 420, 330, 220 is enclosed in side a guard ring structure and, alternatively a multiple guard ring structure such as a triple guard ring structure.

For another embodiment, the conductors can be arranged in precise lengths and close proximity to one another so that any induced voltage affects the entire circuit evenly. For another embodiment, the circuit components are geometrically symmetrical so as to reduce any phase shifting in any differential signal paths.

Figure 3:
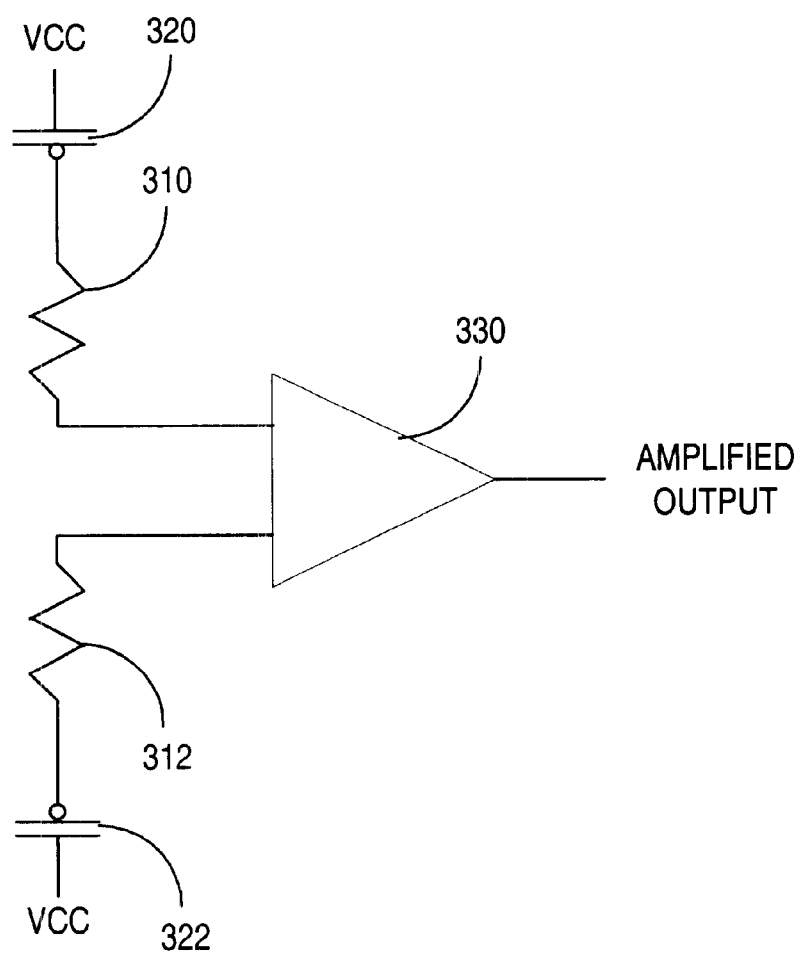
FIG. 3 illustrates a dual differential random noise source of one embodiment.

The resistive source of the thermal noise is isolated from dc voltages for one embodiment. This isolation is used to substantially eliminate shot noise and excess noise. Excess noise has a 1/f noise bandwidth and should be avoided as it can affect the overall noise characteristics of the resistors. For another embodiment, as illustrated in FIG. 3, the resistive thermal noise source 310 is isolated from dc source VCC by placing a capacitor 320 in series with the resistive thermal noise source 310. Such an arrangement creates a RC circuit in the resistive thermal noise source. FIG. 3 also illustrates an optional second identical resistive thermal noise source 312 can be connected in parallel for an alternative embodiment.

For one embodiment, the dual, parallel thermal noise sources 310, 312 are coupled to the inputs of a differential amplifier 330. The amplifier 330 amplifies the differences between the two thermal noise sources 310, 312.

Because the thermal noise source produces a typically very low voltage of 5–50 $\mu$V, the thermal noise must be amplified before it can be used. For one embodiment, the amplifier 330 is a high gain amplifier circuit. For one example, the high gain amplifier has a gain of at least 200. The amplifier 330 could also have much higher gains such as over 1000. For an alternative embodiment, the amplifier 330 includes multiple stages of amplification with a high gain stage or stages followed by a lower gain stage or stages.

Figure 3A:
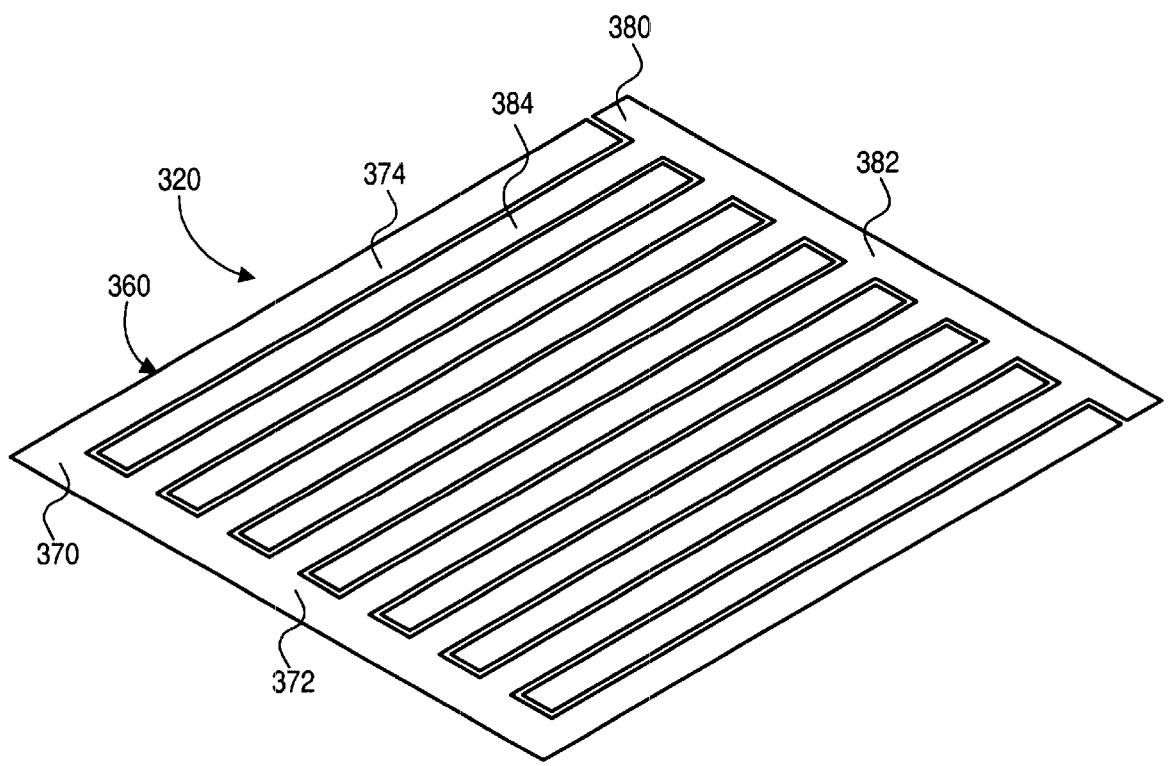
FIG. 3A shows a finger capacitor of one embodiment.

For an alternative embodiment, capacitors 320, 322 are finger capacitors. One example of a finger capacitor is illustrated in FIG. 3A. One embodiments of a fingered capacitor includes a first capacitor element in a first layer of an integrated circuit (IC) die. The first capacitor elements include a positive plate and a negative plate. Each of the positive and negatives plates have a plurality of fingers interdigitated with the fingers of the other of the positive and negatives plates. The fingers are separated by a dielectric. The interdigitated fingers of the positive and negative plates cooperate to generate fringe capacitance between neighboring fingers.

The lateral side-to-side fringe capacitance between the neighboring fingers can generate a relatively large capacitance in a small area. The basic structure of the first capacitor element can be formed in a first layer of an IC die. Additional capacitor elements including positive plates and negative plates having interdigitated fingers can be formed on additional layers of the die. The additional capacitor elements are preferably stacked vertically with respect to each other or the first capacitor element. The respective positive and negative plates of the stacked capacitor elements can be shorted. In addition to the fringe or side-to-side fringe capacitance generated within each capacitor element, vertical interlayer capacitance can be generated between the respective portions of positive and negative plates of the capacitor elements.

FIG. 3A shows a capacitor 320 including a first capacitor element 360. First capacitor element 360 includes a positive plate 370 and a negative plate 380. Positive plate 370 has a comb-like structure that includes an elongated end portion 372 having positive plate fingers 374 extending from the end portion 372. Fingers 374 are preferably evenly spaced and have consistent widths and lengths. Negative plate 380 includes an elongated end portion 382 that has fingers 384 extending therefrom.

In the embodiment of the first capacitor element 360 shown in FIG. 3A, fingers 374 and 384 extend perpendicular to their respective end portions 372 and 382. Fingers 374 and 384 are interdigitated within the same layer of the integrated circuit die (not shown). A dielectric such as silicon dioxide ($SiO_2$) fills the space between the respective fingers 374 and 384. Current integrated circuit manufacturing techniques allow the spacing between the fingers to be close enough such that fringe capacitance between the vertical edges of adjacent fingers within each layer is generated. Capacitance has been found to increase as the spacing between the fingers decreases. The newest techniques of forming devices in integrated circuits allow smaller spacing between fingers to generate relatively large amounts of fringe capacitance.

Figure 4:
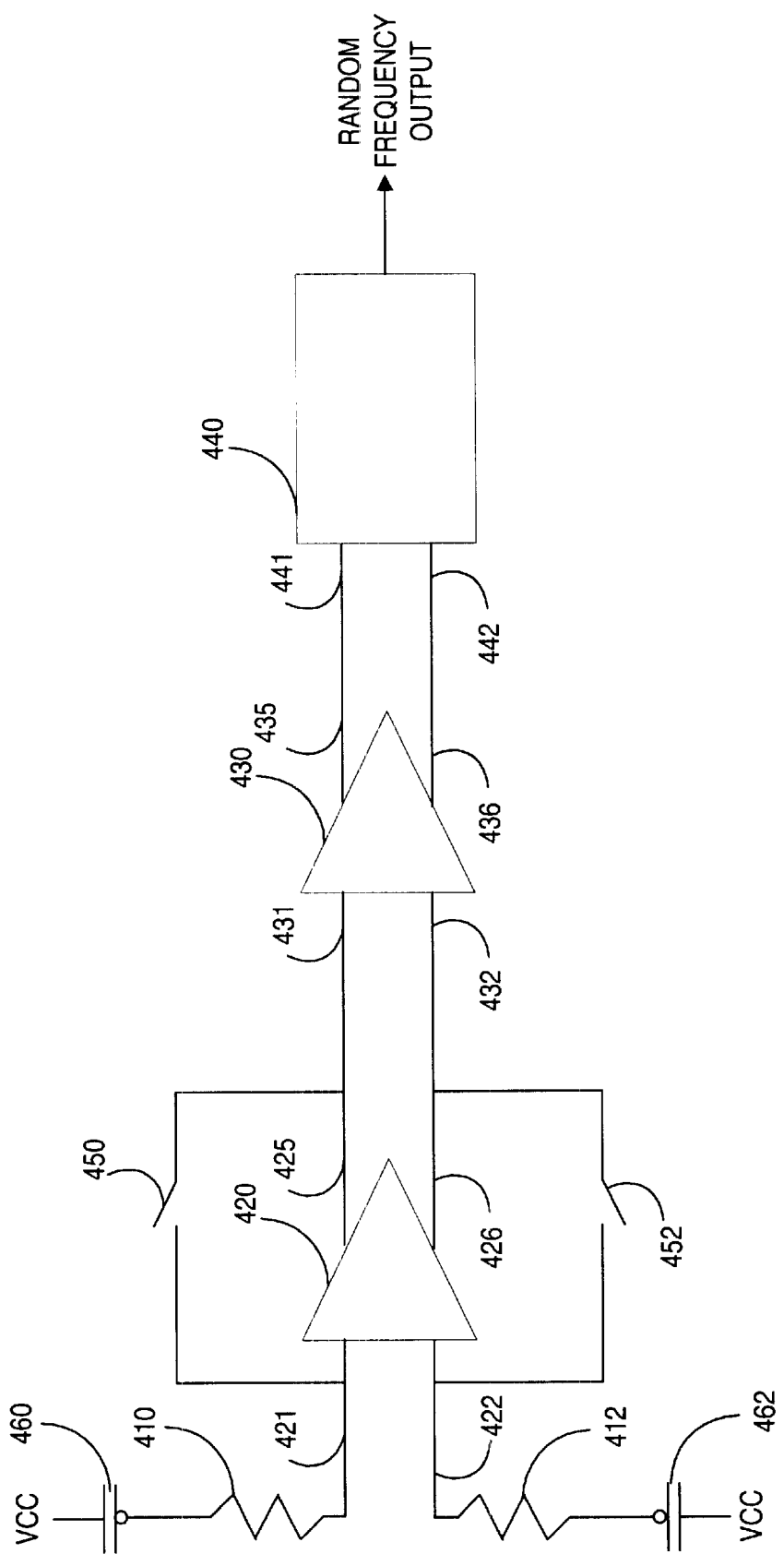
FIG. 4 illustrates a simplified schematic diagram of a fully differential random frequency generator of one embodiment.

FIG. 4 illustrates another embodiment of two parallel thermal noise sources 410, 412 coupled to differential inputs 421, 422 of a first stage amplifier 420. The differential outputs 425, 426 of the first stage amplifier 420, are coupled to the differential inputs 431, 432 of a second stage amplifier 430. The differential outputs 435, 436 of the second stage amplifier 430 are then coupled to the inputs 441, 442 of a fully differential controlled oscillator 440. The controlled oscillator 440 oscillates about a mean frequency. The output frequency of the oscillator varies according to the input.

The circuit illustrated in FIG. 4 operates as follows. First, the switches 450, 452 are closed. Closing the switches charges capacitors 460, 462 to an equilibrium voltage. The switches 450, 452 are then opened and the charged capacitors 460, 462 bias the inputs differential inputs 421, 422 of the first stage amplifier 420. The first stage amplifier 420 then amplifies the fundamental thermal noise signal from the resistors 410, 412 in a high gain mode.

The differential outputs 425, 426 of the first stage amplifier 420, then couple the amplified fundamental noise signal to the differential inputs 431, 432 of a second stage amplifier 430. The differential outputs 435, 436 of the second stage amplifier 430 then couple the amplified fundamental noise signal to the inputs 441, 442 of a fully differential controlled oscillator 440. The controlled oscillator 440 oscillates about a mean frequency.

Recall the fundamental thermal noise signal from the resistors 410, 412 is approximately 5–50 $\mu V$, therefore if, for example the amplifier system has an overall gain of 200, then the amplified fundamental noise signal would have approximately 1–10 mV amplitude.

The two switches 450, 452 have multiple uses in the circuit. First when the switches are closed, the inputs are shorted to the output and the two voltages settle to an equilibrium voltage. The capacitors then charge to the equilibrium voltage with a RC time constant. Once the switches are opened, the capacitors hold the charge and bias the inputs to the first stage amplifier 420. Thus an input bias for the first stage amplifier 420 input is created. Closing the switches is referred to as equalization. During equalization, the fundamental noise signal is only slightly amplified and therefore does not significantly impact or vary the frequency of the controlled oscillator 440. Because the frequency of the controlled oscillator 440 is not significantly varied during equalization, then the output of the controlled oscillator 440 is no longer random. Because the output of the controlled oscillator 440 is not random during equalization, a timing mechanism must be established in the circuit which uses the random frequency output so that the non-random frequencies generated during equalization is not used.

When the switches are open, the first stage amplifier 420 operates in high gain, open loop mode and amplifies the noise signal from the resistors applied at the inputs. This high gain mode is referred to as the active mode. The sampling and holding of the first stage equalization voltage on the capacitors prevents DC current from flowing through the resistors so that no excess noise is generated in the resistors. The white noise characteristics of the total resistor noise are thereby preserved. The sampling and holding corrects the first stage amplifier 420 offset voltage to the first order. So the net offset voltage at the output of the first stage amplifier 420 is equal to the total input offset voltage in the active mode. If the sample and hold is not employed, the output offset voltage will be large and is equal to gain times the input offset voltage. The sample and hold also cuts off all 1/f noise components of first stage amplifier 420 below the sampling frequency. This is a significant advantage as most of the 1/f noise is concentrated in the low frequency region.

For one embodiment, the capacitors 460, 462 have a greater capacitance than the inputs 421, 422 of the first stage amplifier 420. This arrangement of capacitance values ensures that the majority of the fundamental noise signal from the resistors 410, 412 are applied to the inputs 421, 422 of the first stage amplifier 420.

The two stages of amplification 420, 430 are designed with input and output DC operating points set to approximately half the power supply voltage. This is designed so that the control inputs of the controlled oscillator 440 are biased at half the power supply voltage to have equal distribution of its oscillation time period about the mean period. As the output voltage of the amplifier stages 420, 430 varies randomly due to thermal noise from the resistors, the controlled oscillator output time period also varies randomly.

For one embodiment the controlled oscillator 440 can be current controlled. For an alternative embodiment the controlled oscillator 440 can be voltage controlled. For another embodiment, as illustrated in FIG. 4, the controlled oscillator is a fully differential input/output voltage controlled oscillator is used. For an alternative embodiment using a fully differential input/output current controlled oscillator, an additional mirroring circuit to mirror the amplifier stages 420, 430 output stage current into the controlled oscillator 440 is required. For another alternative embodiment, such a mirroring circuit can also be part of the amplification stages.

Figure 5:
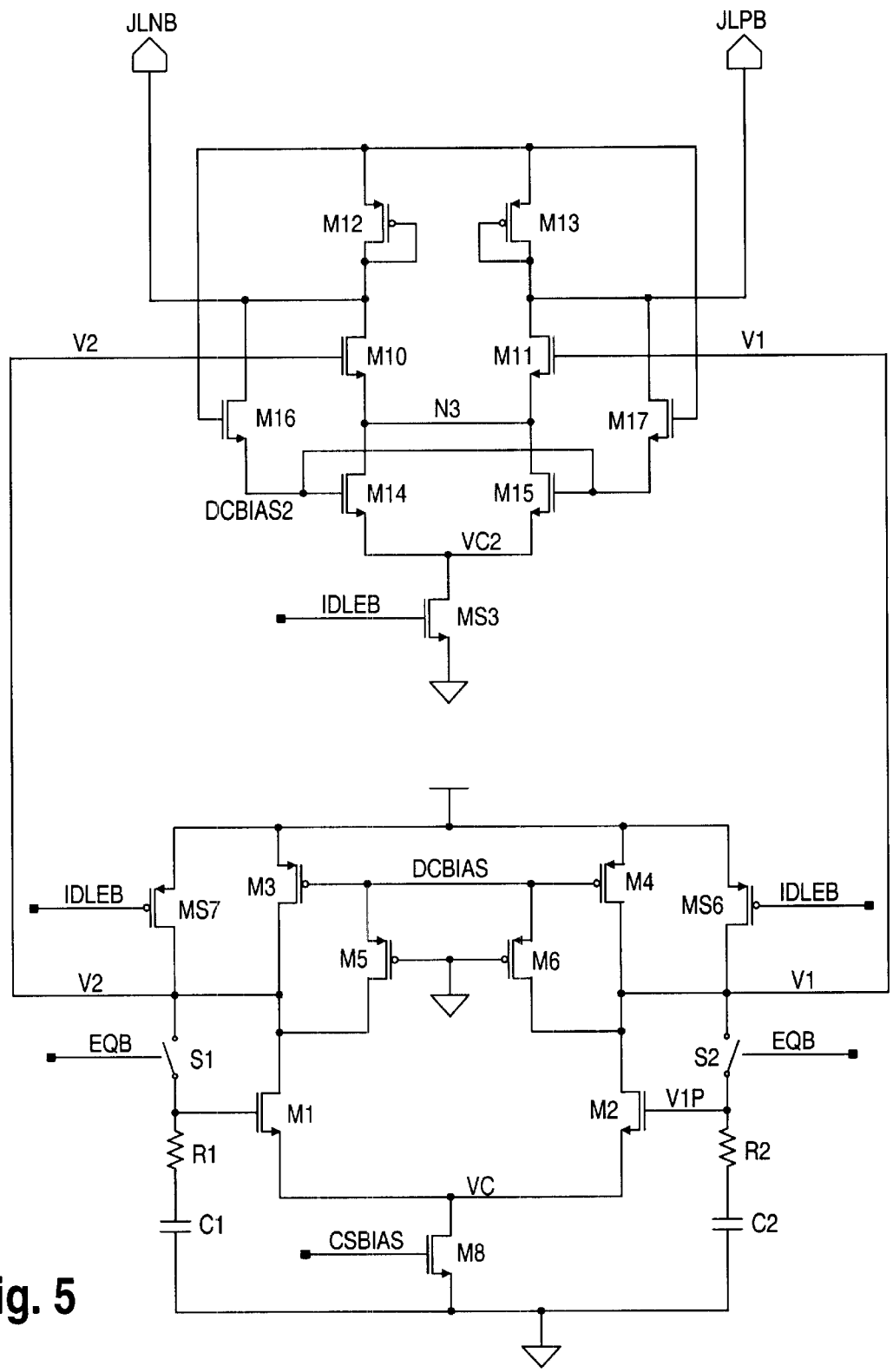
FIG. 5 shows a simplified schematic diagram of a dual differential random noise source and amplification stages of one embodiment.

FIG. 5 illustrates one embodiment of a circuit including the dual thermal noise generating circuits 510, 520, the differential first stage amplifier 530 and the differential second stage amplifier 550. The thermal noise from R1 is applied to the gate of the first stage amplifier 530 input M1. Similarly, thermal noise from R2 is applied to the gate of the first stage amplifier 530 input and M2. Equalization switches S1, S2 are controlled by a EQ signal. The equalization switches S1, S2 are connected across the respective inputs and outputs. M8 is the first stage amplifier 530 current source. The RC input networks C1/M1 and C2/M2 determine the bandwidth of the amplifier. M3 and M4 are the load transistors. The gates of M3 and M4 are biased by the common mode output voltage using M5 and M6.

The outputs V1 and V2 of the first stage amplifier 530 are coupled to the inputs V1 and V2 of the second stage amplifier 550. V1 is applied to the gate of M10 and V2 is similarly applied to the gate of M11. M14 and M15 form the second stage amplifier 550 current source. The bias current through M14 and M15 is controlled by the common mode output voltage of the second stage amplifier 550 output. MS3 is an enable or disable device to enable or disable the second stage amplifier 550.

For alternative embodiments, other known differential amplifier circuits could be used instead of the configurations described above. For one alternative embodiment the types of transistors can be reversed i.e. PMOS types instead of NMOS types and NMOS types instead of PMOS types combined with the corresponding changes to the supply and bias voltages.

Figure 6:
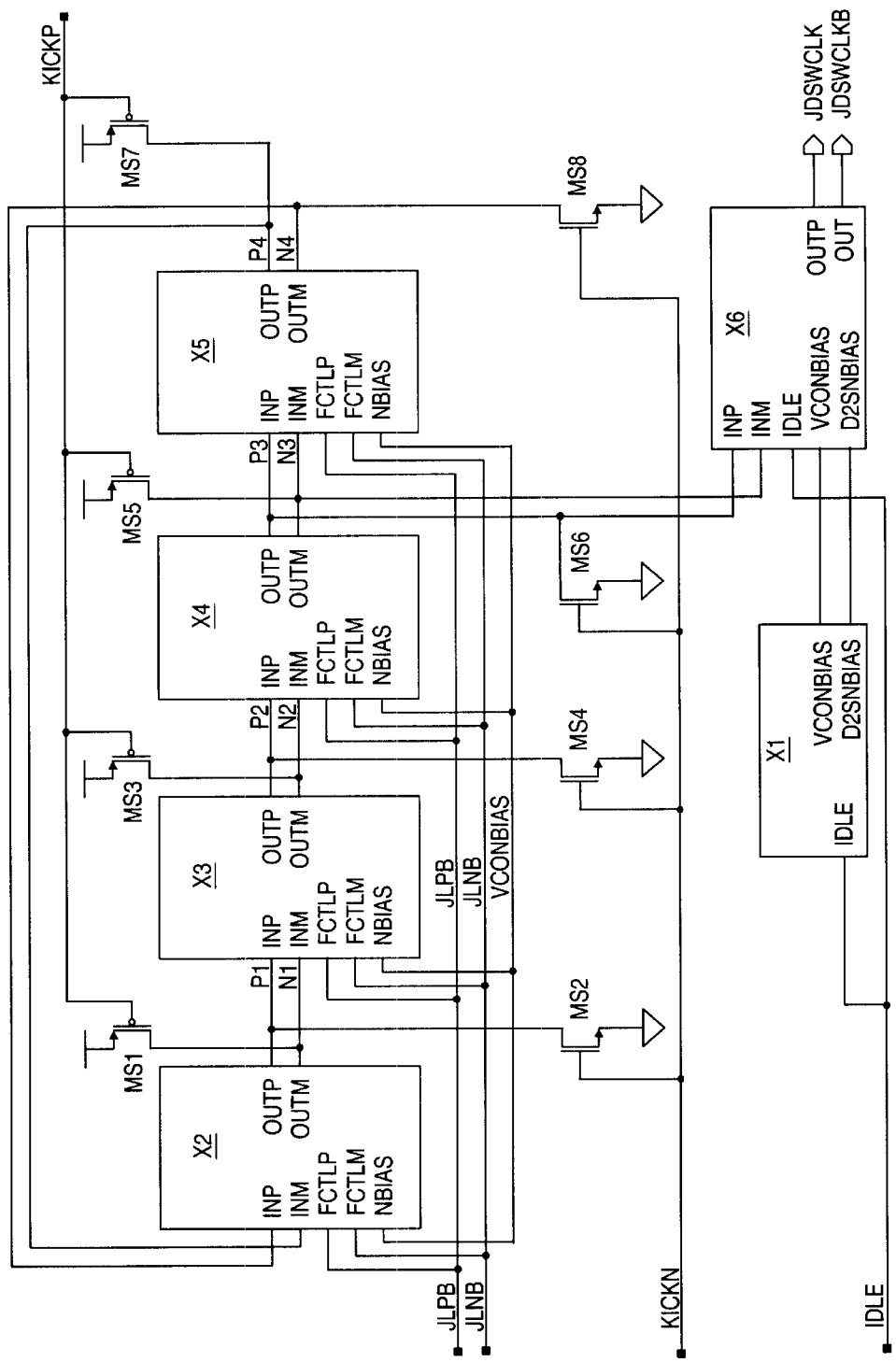
FIG. 6 shows a simplified schematic diagram of a fully differential voltage controlled oscillator of one embodiment.

FIG. 6 illustrates one embodiment of a differential voltage controlled oscillator 610. The oscillator 610 is a 5-stage oscillator (stage X2–X5) with the output of stage X5 twisted and coupled to the input of stage X2. X1 provides the biasing voltages. X6 converts the oscillator output signal from X4 from a less than rail to rail amplitude to a rail to rail (i.e. 0-vcc) oscillator signal. Start-up transistors MS1–MS8 provide the initial start-up pulses to initiate the respective oscillator stages X2–X5 operation. The voltage control signal i.e. the amplified random noise signal from the amplifiers, is applied to differential inputs JLNB and JLPB. The voltage control signal causes the switching frequency of each stage X2–X5 to vary.

For one embodiment, the differential voltage controlled oscillator 610 is constructed symmetrically such that all the components are symmetrical or matching in their respective values and the lengths of the various current paths are symmetrical such that phase shifting is substantially eliminated. The symmetrical construction increases the overall quality of the output signal.

Figure 7:
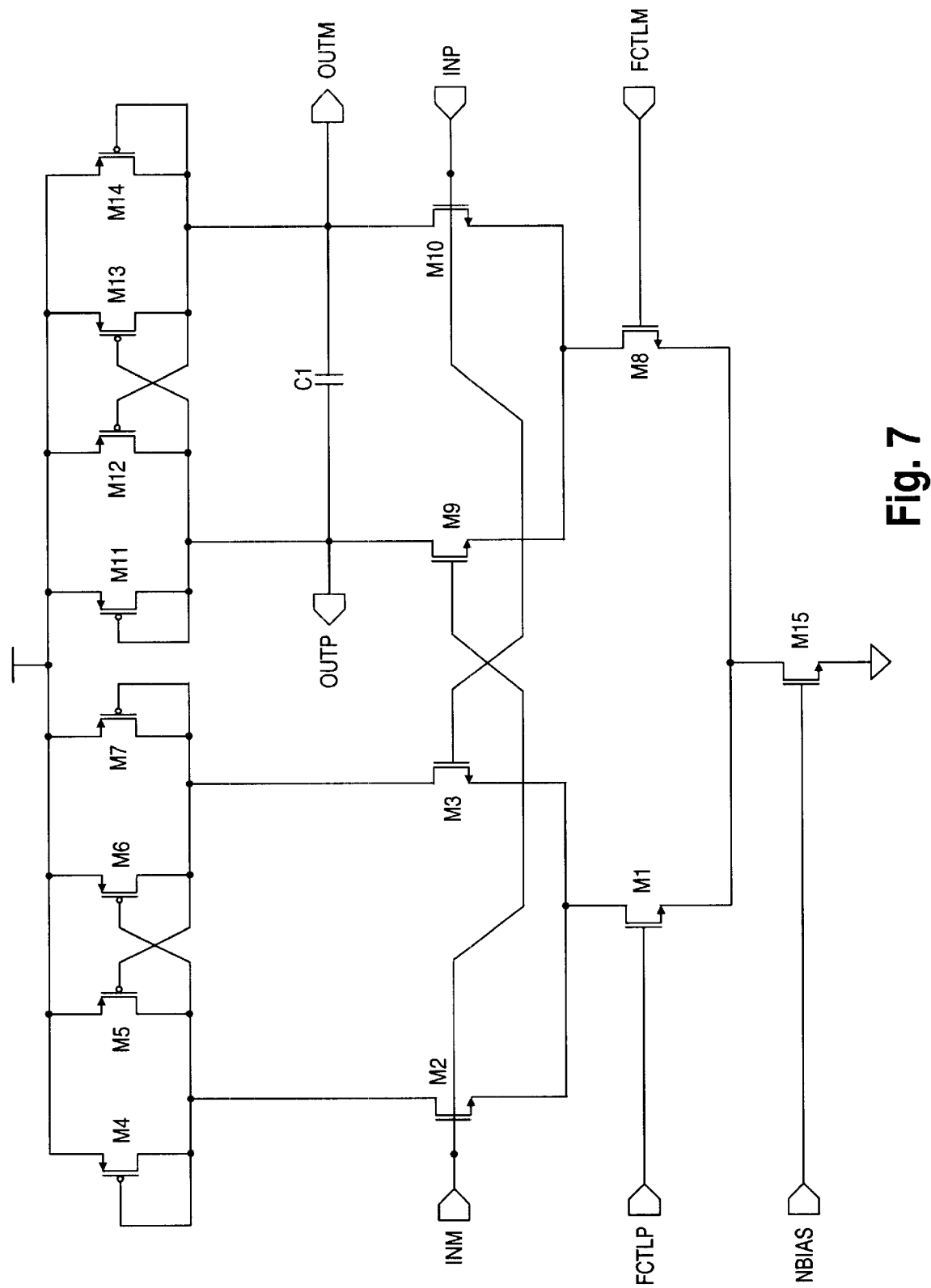
FIG. 7 illustrates one stage of a fully differential voltage controlled oscillator of one embodiment.

FIG. 7 illustrates one embodiment of one of the oscillator 610 stages X2–X5. The stage or cell is fully differential in construction and operation. The circuit forming the left portion of the stage including transistors M1–M7, is identical to the circuit forming the right portion of the stage including transistors M8–M14. This symmetry is to ensure even current steering in both right and left portions of the stage in the operation. M1 and M8 are biasing transistors for their respective portions. The voltage control signal i.e. the amplified random noise signal from the amplifiers, is applied to the gates of M1 and M8 which then causes the biasing voltage to the right and left portions to vary with the noise signal. This variation in bias voltage causes the switching time or oscillation frequency of the right and left portions to vary with the noise signal, resulting in an oscillation centered on a mean frequency but varying above and below the mean frequency according to the noise signal. M15 is a DC current source. The differential inputs are applied to the gates of M2 and M10. M2 and M10 are then cross-coupled to M9 and M3 respectively. The output of the cell is taken across the right portion across capacitor C1. M12 and M13 are cross-coupled to provide the differential amplification/switching of the input signal. The output frequency and the output voltage swing are determined by the values of M11–M14 and C1 and the current flow through the stage.

For one embodiment, C1 can be a parallel plate capacitor. For an alternative embodiment, C1 can be a PMOS or NMOS transistor or a combination of both a PMOS and NMOS transistors or other types of transistors. For another alternative embodiment, either M11 or M14 and their respective equivalents, M4 and M7 could be removed to simplify the circuit. Of course switching PMOS for NMOS type transistors and adjusting the input voltages accordingly could also be accomplished for another embodiment.

The voltage control signal i.e. the differential amplified random noise signals from the amplifiers, are applied to FCTLP and FCTLM terminals which are coupled to the respective gates of M1 and M8 which then causes the biasing voltage to the right and left portions to vary with the noise signal. This variation in bias voltage causes the switching time or oscillation frequency of the right and left portions to vary with the noise signal, resulting in an oscillation centered on a mean frequency but varying above and below the mean frequency according to the noise signal.

For alternative embodiments other types of differential oscillators and non-differential oscillators could also be used in the present invention. For another embodiment, a non-rail-to-rail oscillator output could be used. For one embodiment the oscillator mean frequency is 500 kHz but other frequencies could also be selected.

For one embodiment, the fundamental noise source, the amplifier and the oscillator can be combined on a single integrated circuit.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method of generating a random frequency comprising:

detecting a fundamental noise signal from a fundamental noise source while blocking electrical current from passing through the fundamental noise source;

amplifying the fundamental noise signal; and mixing the amplified fundamental noise signal with an oscillator signal.

2. The method as recited in claim 1, wherein the fundamental noise signal from the fundamental noise source is less than 50 microvolts.

3. The method as recited in claim 1, wherein the fundamental noise is thermal noise.

4. The method as recited in claim 1, wherein the fundamental noise source includes a resistor.

5. The method as recited in claim 1, further comprising, isolating the fundamental noise source from a plurality of external noise sources.

6. The method as recited in claim 1, further comprising providing an isolated power source.

7. The method as recited in claim 1, wherein amplifying the fundamental noise signal includes amplifying the fundamental noise signal in a plurality of amplifying stages coupled in series.

8. The method as recited in claim 1, wherein amplifying the fundamental noise signal includes amplifying to a gain of at least 200.

9. The method as recited in claim 1, wherein the fundamental noise source includes a plurality of noise sources and wherein amplifying the fundamental noise signal includes differentially amplifying at least two of the plurality of fundamental noise sources.

10. The method as recited in claim 9, wherein the oscillator is a differential oscillator.

11. The method as recited in claim 1, wherein the oscillator produces a rail to rail output signal.

12. The system as recited in claim 1, wherein amplifying the fundamental noise signal includes substantially eliminating a first order noise from an amplifying stage.

13. A system for generating a random frequency comprising:
    a fundamental noise source, wherein electrical current is blocked from passing through the fundamental noise source;
    an amplifier having an input coupled to the fundamental noise source; and
    an oscillator having a control input coupled an output of the amplifier.

14. The system as recited in claim 13 wherein a fundamental noise signal from the fundamental noise source is less than 50 microvolts.

15. The system as recited in claim 13, wherein the fundamental noise is thermal noise.

16. The system as recited in claim 13, wherein the fundamental noise source includes a resistor.

17. The system as recited in claim 16, wherein the fundamental noise further includes a capacitor coupled in series with the resistor.

18. The system as recited in claim 17, further comprising a circuit for charging the capacitor.

19. The system as recited in claim 18, wherein the capacitor is charged during a sample period.

20. The system as recited in claim 16, wherein the capacitor is a finger capacitor.

21. The system as recited in claim 13, further comprising providing shielding to the fundamental noise source such that the fundamental noise source is substantially shielded from a plurality of external noise sources.

22. The system as recited in claim 13, further comprising, an isolated power supply wherein, the isolated power supply is isolated from a plurality of external noise sources.

23. The system as recited in claim 13, wherein the fundamental noise source is arranged such that an induced voltage and an induced current are substantially eliminated.

24. The system as recited in claim 13, wherein the amplifier includes a plurality of amplifiers coupled in series.

25. The system as recited in claim 24, wherein at least one of the plurality of amplifiers is an amplifier having a gain of at least 200.

26. The system as recited in claim 24, wherein each one of the plurality of amplifiers includes a differential amplifier and the fundamental noise source.

27. The system as recited in claim 24, wherein the fundamental noise source includes two fundamental noise sources, each fundamental noise source providing a fundamental noise signal to a separate input of a first one of the plurality of differential amplifiers.

28. The system as recited in claim 27, wherein the plurality of differential amplifiers are coupled in series and the differential outputs of the plurality of differential amplifiers are applied to the input of a differential control input to the oscillator and wherein the oscillator is a differential oscillator.

29. The system as recited in claim 13, wherein the oscillator produces a rail to rail output signal.

30. The system as recited in claim 13, wherein the fundamental noise source, the amplifier and the oscillator are combined on a single integrated circuit.

31. A system for generating a random frequency comprising:
    a pair of identical, fundamental noise sources, wherein electrical current is blocked from passing through each one of the fundamental noise sources;
    a differential amplifier system having two inputs, one input coupled to each one of the fundamental noise sources; and
    a differential voltage controlled oscillator having two differential control inputs, one input coupled to each one of two differential outputs of the differential amplifier system;
    wherein the fundamental noise sources, the amplifier system and the oscillator are combined on a single integrated circuit.

32. The system as recited in claim 31, wherein the pair of identical, fundamental noise sources and the differential amplifier system are substantially shielded from a plurality of external inductive current sources.

33. A fundamental noise source comprising:
    a resistive thermal noise source wherein the resistive thermal noise source is coupled to an input of a detector; and
    a capacitor coupled in series with the resistive thermal noise source wherein the capacitor blocks direct current flow through the resistive thermal noise source to the input of the detector and wherein the capacitor has a capacitance greater than an input capacitance of the detector and wherein the capacitor is a finger capacitor.

34. The fundamental noise source of claim 33 wherein a fundamental noise signal from the resistive thermal noise source is less than 50 microvolts.

* * * * *